United States Patent
Liu et al.

(10) Patent No.: US 6,387,800 B1
(45) Date of Patent: May 14, 2002

(54) METHOD OF FORMING BARRIER AND SEED LAYERS FOR ELECTROCHEMICAL DEPOSITION OF COPPER

(75) Inventors: Chung-Shi Liu, Hsin-Chu; Shau-Lin Shue, Hsinchu, both of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/467,117

(22) Filed: Dec. 20, 1999

(51) Int. Cl.[7] .............................................. H01L 21/44
(52) U.S. Cl. ...................... 438/653; 257/751; 204/192
(58) Field of Search ................................. 438/723, 740, 438/743, 785, 653–655, 680–688; 257/751–754, 762; 204/192; 216/67, 76

(56) References Cited

U.S. PATENT DOCUMENTS

| | | | |
|---|---|---|---|
| 5,316,974 A | 5/1994 | Crank | 437/190 |
| 5,654,233 A | 8/1997 | Yu | 438/643 |
| 5,821,168 A | 10/1998 | Jain | 438/692 |
| 5,882,399 A | 3/1999 | Ngan et al. | 117/89 |
| 5,897,368 A | 4/1999 | Cole, Jr. et al. | 438/625 |
| 5,961,793 A * | 10/1999 | Ngan | 204/192.12 |
| 6,235,163 B1 * | 5/2001 | Angelo et al. | 204/192.12 |

* cited by examiner

Primary Examiner—Matthew Smith
Assistant Examiner—Calvin Lee
(74) Attorney, Agent, or Firm—George O. Saile; Stephen B. Ackerman

(57) ABSTRACT

A process in the fabrication of integrated circuits has been developed for copper diffusion barrier layer and copper seed layer. The invention teaches a method of combining ion metal plasma (IMP) deposition techniques, i.e., with and without AC/Rf bias, in a series of steps or cycles (of at least four or more cycles depending on device geometry), of AC/Rf bias "ON", AC/Rf bias "OFF", to form both the copper metal diffusion barrier (reactive IMP) and then subsequently, the copper seed layer. The current invention applies to lining both a single and dual damascene structure to form a copper metal barrier layer, TaN, and copper seed layer for interconnects and vias prior to electrochemical deposition (ECD) of copper.

42 Claims, 1 Drawing Sheet

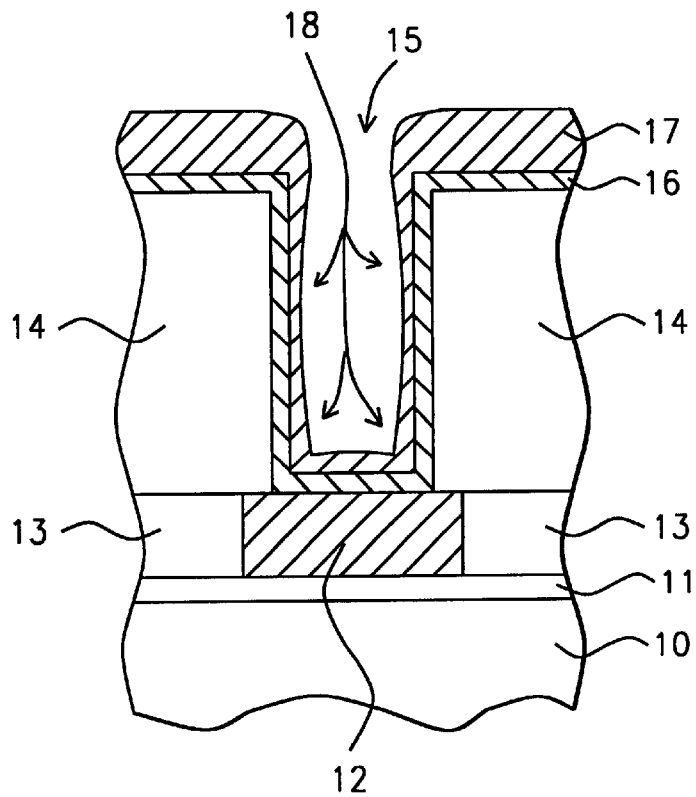
FIG. 1 – Prior Art
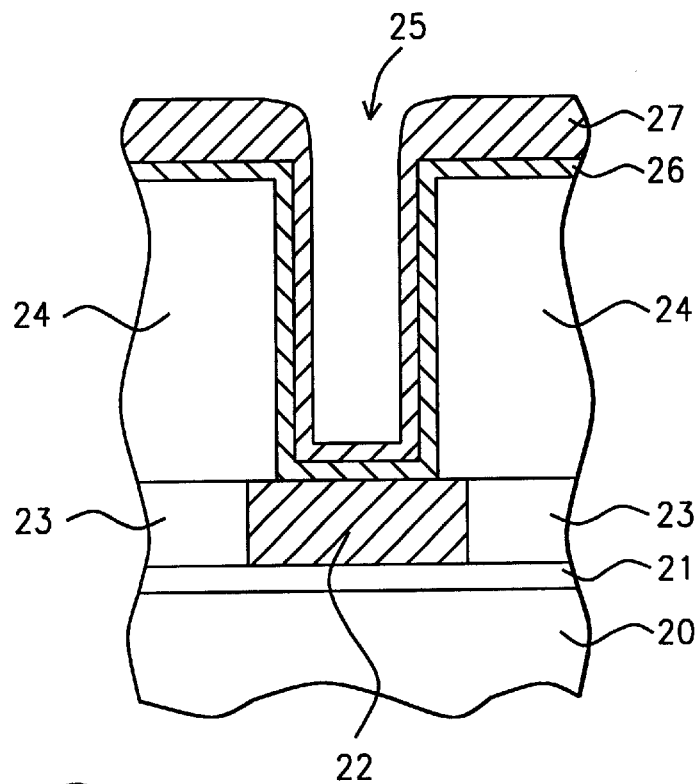
FIG. 2

METHOD OF FORMING BARRIER AND SEED LAYERS FOR ELECTROCHEMICAL DEPOSITION OF COPPER

BACKGROUND OF THE INVENTION

1. Field of the Invention

This invention relates to a robust method of fabrication used for semiconductor integrated circuit devices, and more specifically to the formation of both a copper metal diffusion barrier layer and a copper seed layer, in a single and dual damascene process, to fabricate reliable metal interconnects and contact vias.

2. Description of Related Art

In the fabrication of semiconductor integrated circuits Prior Art methods of forming both a copper metal diffusion barrier layer and a copper seed layer, in dual damascene processing for interconnects and vias, widely use an ion metal plasma (IMP) to sputter deposit these layers prior to electrochemical deposition (ECD) of copper. The ion metal plasma (IMP) methods typically use either a plain deposition without AC/Rf bias or use a deposition with an AC/Rf bias "ON" continuously, or combine the two types into a "two step" process. The terms "ion deposition sputtered" and "ion metal plasma (IMP) refer to sputter deposition, wherein a magnet array is placed behind the target (magnetron sputter deposition) and an inductively coupled Rf source is positioned between the target (cathode) and substrate. Some portion of the sputtered atoms arrive at the substrate in the form of charged ions. Also, the terms "reactive ion deposition" or "reactive ion metal plasma (IMP) refer to ion-deposition sputtering wherein a reactive gas is supplied during sputtering, e.g., sputtering of Ta in $N_2$ to form a TaN barrier layer. Related patents and relevant literature now follow as Prior Art.

U.S. Pat. No. 5,882,399 (Ngan et al.) describes an ion metal plasma (IMP) sputter process and tool set. The aluminum <111> crystal orientation content of an aluminum interconnect layer or the copper <111> crystal orientation content of a copper interconnect can be maintained at a consistently high value during the processing of an entire series of semiconductor substrates in a given process chamber. To provide the stable and consistent aluminum <111> content, or the stable and consistent copper <111> content, it is necessary that the barrier layer structure underlying the aluminum or the copper have a consistent crystal orientation throughout the processing of the entire series of substrates, as well. To ensure the consistent crystal orientation content of the barrier layer structure, it is necessary to form the first layer of the barrier layer structure to have a minimal thickness of at least about 150 Å, to compensate for irregularities in the crystal orientation which may by present during the initial deposition of this layer. As an alternative to increasing the thickness of the first layer of the barrier layer structure, this first layer can be deposited at a low process chamber pressure, so that harmful irregularities in the crystal orientation are eliminated.

U.S. Pat. No. 5,654,233 (Yu) describes a barrier layer process that is interrupted with a partial etch back using reactive ion etch (RIE) to planarize an excessively thick barrier layer. It teaches a process for creating a planar topography and enhanced step coverage for the fabrication of contact/via holes in sub-half-micron diameter range with high height vs. dimension aspect ratio. This is accomplished by interrupting the deposition of the barrier layer in the contact/via lining with a programmed reactive ion etching process, which will protect the thin barrier lining in the bottom part of the contact hole, but will etch off and planarize the excessively thick barrier layer near the opening of the hole. The resulting barrier layers show a disrupt columnar film structure which provides better barrier during subsequent metal fill deposition process.

U.S. Pat. No. 5,897,368 (Cole, Jr. et al.) teaches a method for fabricating metallized vias with steep sidewalls. It includes applying a first seed layer extending over a horizontal surface and via sidewalls of a dielectric material and exposed underlying contact metallization; removing at least some of the first seed layer from the contact metallization and the horizontal surface while leaving a sufficient amount of the first seed layer on the sidewalls as a catalyst for subsequent application of a third seed layer; sputtering a second seed layer over the contact metallization and the horizontal surface; using an electroless solution to react with the first seed layer and apply the third seed layer over the sidewalls; and electroplating an electroplated layer over the second and third seed layers.

U.S. Pat. No. 5,821,160 (Jain) describes a process for forming a semiconductor device in which an insulating layer is nitrided and then covered by a thin adhesion layer before depositing a composite copper layer. This process does not require a separate diffusion barrier as a portion of the insulating layer has been converted to form a diffusion barrier film. Additionally, the adhesion layer is formed such that it can react with the interconnect material resulting in strong adhesion between the composite copper layer and the diffusion barrier film, as well as, allow a more continuous interconnect and via structure.

U.S. Pat. No. 5,316,974 (Crank) describes a process for forming a copper seed layer. A metallized structure is formed from a copper seed layer and a copper structure. Semiconductor devices to be connected are covered by a conductive barrier layer. An oxide layer is then deposited over the barrier layer and patterned using standard photolithographic techniques and an anisotropic plasma etch. Vertical side walls are formed by the etch and an HF deglaze. A seed layer is then sputtered onto a photoresist layer and the exposed barrier layer. After stripping the photoresist and the seed layer thereon, the copper structure is electroplated over the remaining seed layer. The structure thus formed has approximately vertical sidewalls for improved contact with subsequent layers.

SUMMARY OF THE INVENTION

It is a general object of the present invention to provide a new and improved robust method of forming both a copper metal diffusion barrier layer and a copper seed layer, in a single and dual damascene process, to fabricate reliable metal interconnects and contact vias.

For completeness provided by the present invention, is a semiconductor substrate with a an insulting layer thereon. A copper metal interconnect typically is patterned within an insulating layer. In addition, a layer of interlevel dielectric (ILD) is deposited and patterned into a trench structure or "gap" opening. Provided can be both a single and dual damascene structure.

A more specific object of the present invention is to provide an improved method of forming an integrated circuit in which the metal diffusion barrier layer and copper seed layer are both deposited by an improved method of deposition which differs significantly from conventional methods. The present invention makes use of the following deposition techniques for the barrier layer and copper seed layer: "ion deposition sputtering" and "ion metal plasma"

(IMP) sputtering, wherein a magnet array is placed behind the target (magnetron sputter deposition) and an inductively coupled Rf source is positioned between the target (cathode) and substrate. Some portions of the sputtered atoms arrive at the substrate in the form of charged ions. In addition, the present invention makes use of "reactive ion deposition" or "reactive ion metal plasma (IMP), wherein a reactive gas is supplied during sputtering in the deposition of a barrier layer of Ta in $N_2$.

The main embodiments of the present invention, the above and other objectives are realized by using a multi-step method of fabricating metal barrier layer and copper seed layer. The present invention teaches a method of combining ion metal plasma (IMP) deposition techniques, i.e., with and without AC/Rf bias, in a series of steps or cycles (of at least four or more cycles depending on device geometry), of AC/Rf bias "ON", AC/Rf bias "OFF", to form both the copper metal diffusion barrier (reactive IMP) and then subsequently, the copper seed layer. The current invention applies to lining both a single and dual damascene structure to form a copper metal barrier layer, TaN, and copper seed layer for interconnects and vias prior to electrochemical deposition (ECD) of copper.

In the first embodiment of the present invention, the uniform defect-free copper metal barrier layer is formed by reactive ion metal plasma (IMP) deposition sputtering, e.g., Ta from a target (cathode) and reacting Ta with a nitrogen gas ambient to yield TaN. The reactive ion metal plasma (IMP) deposition is performed with and without AC/Rf bias, in a series of steps or cycles (of at least four or more cycles depending on device geometry), of AC/Rf bias "ON", AC/Rf bias "OFF", to form the copper metal diffusion barrier (reactive IMP). The process can be extended to Ta/TaN/TaN barrier layers for better adhesion.

In the second embodiment of the present invention, similar to the multi-step deposition of the barrier layer, a uniform defect-free copper seed layer is ion metal plasma (IMP) deposited (without reactive sputtering), i.e., with and without AC/Rf bias, in a series of steps or cycles (of at least four or more cycles depending on device geometry), of AC/Rf bias "ON", AC/Rf bias "OFF", to form both the copper seed layer.

Another object of the present invention is to provide an improved method of forming copper interconnect and via contacts. Therefore, for completeness, is the next processing step in building of a single or dual damascene structure, the deposition of copper upon the seed layer, by electrochemical copper deposition (ECD). The kinetics of the electroless copper deposition process are based on a uniform, defect-free seed layer. It is the aforementioned defects in the seed layer and in ECD fill of the single and dual damascene structures, that the present invention addresses and provides solutions to these process problems. The final processing step in building of the single and dual damascene structure is the chemical mechanical polishing (CMP) back of the excess electroless deposited copper metal, excess seed layer and excess barrier layer. The copper is chem-mech polished back without dishing. Device applications include MOSFET and CMOS devices.

This invention has been summarized above and described with reference to the preferred embodiments. Some processing details have been omitted and are understood by those skilled in the art. More details of this invention are stated in the "DESCRIPTION OF THE PREFERRED EMBODIMENTS" section.

BRIEF DESCRIPTION OF THE DRAWINGS

The object and other advantages of this invention are best described in the preferred embodiments with reference to the attached drawings that include:

FIG. 1, which in cross-sectional representation illustrates Prior Art methods.

FIG. 2, which in cross-sectional representation illustrates the preferred embodiments of the present invention.

DESCRIPTION OF THE PREFERRED EMBODIMENTS

This invention relates to a new and improved robust method of forming both a copper metal diffusion barrier layer and a copper seed layer, in a single and dual damascene process, to fabricate reliable metal interconnects and contact vias.

Referring to FIG. 1 illustrated in cross-sectional drawing, for completeness provided by Prior Art, is a semiconductor substrate 10 with an insulating layer 11. A copper metal interconnect 12 is patterned within an insulating layer 13. In addition, a layer of dielectric 14 is deposited and patterned into a trench 15 (gap) opening in FIG. 1. Provided is a single damascene structure 15 and/or a dual damascene structure (not shown in FIGURES).

Referring again in more detail to FIG. 1, which is a cross-sectional representation of Prior Art methods of forming both a copper metal diffusion barrier layer 16 (TaN) and a copper seed layer 17, in dual damascene processing for interconnects and vias. These Prior Art methods widely use an ion metal plasma (IMP) to sputter deposit these layers prior to electrochemical deposition (ECD) of copper (not shown in FIGURES). Note the seed layer's 17 poor coverage of the sidewalls 18 (arrows) due to the re-sputtering from the bottom of trench to the lower sidewall. In addition, the there is insufficient coverage of the upper sidewall 18. Moreover, a thin layer of copper oxide (too thin to be shown in FIGURES) forms all over the seed layer 17. More damage is done to the seed layer in the acidic electroplating bath for the electrochemical deposition (ECD) of the subsequent thick copper layer since the acid removes the copper oxide layer, leaving behind a very thin seed layer. These very thin seed layer regions can have discontinuities or limited current paths for the electroplating process.

Again with reference to FIG. 1, the ion metal plasma (IMP) methods, found in Prior Art methods, typically use either a plain deposition without AC/Rf bias or use a deposition with an AC/Rf bias "ON" continuously, or combine the two types into a "two step" process. The terms "ion deposition sputtered" and "ion metal plasma (IMP) refer to sputter deposition, wherein a magnet array is placed behind the target (magnetron sputter deposition) and an inductively coupled Rf source is positioned between the target (cathode) and substrate. Some portion of the sputtered atoms arrive at the substrate in the form of charged ions. Also, the terms "reactive ion deposition" or "reactive ion metal plasma (IMP) refer to ion-deposition sputtering wherein a reactive gas is supplied during sputtering, e.g., sputtering of Ta in $N_2$ to form a TaN barrier layer 16. The poor seed layer 17 profile 18 leads to deleterious effects to the subsequent electrochemical deposition (ECD) of copper, i.e., interconnect reliability and electromigration problems. Scanning electron microscopy (SEM) analysis of the aforementioned two cycle seed layer and electrochemical deposition (ECD) of copper shows that the films produced by the conventional methods described contain voids both in the center of the trench and near the edges.

Referring to FIG. 2 illustrated in cross-sectional drawing, is the shown the main embodiments of the present invention. For completeness the following is provided by the present invention, a semiconductor substrate 20 with an insulating layer 21. A copper metal interconnect 22 is patterned within an insulating layer 23, a first layer insulator or dielectric, forming an interlevel dielectric (ILD). In addition, a layer of dielectric 24, a second layer of insulator, is deposited and patterned into a trench 25 (gap) opening in FIG. 2. All insulating layers or dielectric layers, are comprised or composed of silicon dioxide or silicon oxide, and the layer of dielectric (24) forms an intermetal dielectric layer (IMD). Provided to the present invention is a single damascene structure 25 and/or a dual damascene structure (not shown in FIGURES).

Referring to again to FIG. 2 illustrated in cross-sectional drawing, the main embodiments of the present invention are shown. The present invention teaches a method of combining both types of ion metal plasma (IMP) layer depositions, i.e., with and without AC/Rf bias, in a series of steps or cycles (of at least four or more cycles depending on device geometry), of AC/Rf bias "ON", AC/Rf bias "OFF", to form both a copper metal diffusion barrier (reactive IMP) 26 and a copper seed layer 27. The current invention applies to lining a dual damascene structure to form a copper metal barrier layer (TaN) 26 and a copper seed layer 27 for interconnects and vias (not shown in FIGURES) prior to electrochemical deposition (ECD) of copper. The uniform defect-free copper metal barrier layer 26 is formed by reactive ion metal plasma (IMP) deposition sputtering, e.g., Ta from a target (cathode) and reacting Ta with a nitrogen gas ambient to yield TaN. The reactive ion metal plasma (IMP) deposition is performed with and without AC/Rf bias, in a series of steps or cycles (of at least four or more cycles depending on device geometry, aspect ratio), of AC/Rf bias "ON", AC/Rf bias "OFF", to form the copper metal diffusion barrier (reactive IMP) 26. The barrier layer process details are as follows: reactive ion metal plasma (IMP) sputter, Applied Endura cluster tool, sputter target size 300 mm, gases Ar and $N_2$, Ar flow rate of about 50 sccm, substrate temperature of about 100° C., total film thickness deposited of about 300 Angstroms, deposition rate of about 600 Angstroms per minute, number of cycles from about 4 to 10, thickness deposition per step is equal to (total film thickness/number of steps), order or sequence of steps is AC "OFF" to AC "ON", to AC "OFF" to AC "ON", etc., pressure of 20 mTorr, DC magnetron power of 1 KW, AC/Rf power of 1.5 KW, AC bias of 350 W, Rf frequency of about 2 MHz. The patterning of the barrier layer is performed by chemical mechanical polishing (CMP) after subsequent processing steps. This process can be extended to Ta/TaN/TaN barrier layers for better adhesion.

The mechanism for improved barrier deposition and the subsequent copper seed layer using ion metal plasma (IMP) process, cycling the AC/Rf bias "ON" and "OFF" from about 4 to 10 cycles, is explained as follows. The first bias "ON" improves film deposition and thickness in the corners and recesses of the trench. The following "OFF" bias step accumulates deposited material on the sidewalls of the trench. Finally, after repeated cycling of this process, the ebb and flow of deposited material balances out to achieve good step coverage inside the trench, in the corners and recesses, as well as, on the trench sidewalls.

With further reference to FIG. 2, in a similar multi-step deposition to the barrier layer, another embodiment of the present invention is deposition of a uniform defect-free copper seed layer 27. Using ion metal plasma (IMP) deposition (without reactive sputtering), the seed layer 27 is deposited, i.e., with and without AC/Rf bias, in a series of steps or cycles (of at least four or more cycles depending on device geometry, aspect ratio), of AC/Rf bias "ON", AC/Rf bias "OFF", to the defect-free copper seed layer 27. The seed layer deposition is similar to that of the barrier layer described earlier. The seed layer process details are as follows: ion metal plasma (IMP) sputter, Applied Endura cluster tool, sputter target size 300 mm, Ar gas, Ar flow rate of about 50 sccm, substrate temperature of about 25° C., total film thickness deposited from about 800 to 2500 Angstroms, deposition rate of about 1500 Angstroms per minute, number of cycles from about 4 to 10, thickness deposition per step is equal to (total film thickness/number of steps), order or sequence of steps is AC "OFF" to AC "ON", to AC "OFF" to AC "ON", etc., pressure of 40 mTorr, DC magnetron power of 1 KW, DC bias of 350 V, AC/Rf power of 3 KW, AC bias of 350 W, Rf frequency of about 2 MHz. The patterning of the barrier layer is performed by chemical mechanical polishing (CMP) after subsequent processing steps.

For completeness and not shown in the figures, is the next processing step in the building of a single or dual damascene structure, namely, the deposition of copper upon the seed layer, by electrochemical copper deposition (ECD). The kinetics of the electroless copper deposition process are based on a uniform, defect-free seed layer. It is the aforementioned defects in the seed layer and in ECD fill of the single and dual damascene structures, that the present invention addresses and provides solutions to these process problems. Details of the electrochemical deposition (ECD) of copper are as follows: sulfuric acid solution, temperatures from approximately −40 to 40° C., deposition rate of approximately 1000 Angstroms/min, copper thickness from approximately 5000 to 20000 Angstroms, copper grain or crystal size from about 1000 to 20000 Angstroms, preferred crystal orientation (111), re-crystallization temperature of about 100 to 300° C. Scanning electron microscopy (SEM) analysis of the four cycle seed layer and electrochemical deposition (ECD) of copper shows that the films produced by the methods described in this invention are free of voids both in the center of the trench and near the edges.

The final processing step in building of the single and dual damascene structure is the chemical mechanical polishing (CMP) back of the excess electroless deposited copper metal, excess seed layer and excess barrier layer. The copper is chem-mech polished back without dishing. Device applications include MOSFET and CMOS devices on a substrate comprised of a semiconductor, single crystal silicon, or on an IC, integrated circuit module. The semiconductor, single crystal silicon is comprised of either an N-type or P-type silicon substrate, or a combination of both N-type and P-type regions, with doped N-type or P-type source and drain regions for N-channel and P-channel CMOS devices. Interconnect wiring lines and contact vias processed under the methods described by the present invention include the following conducting metals: Cu, AlCu alloys, and W studs or plugs for contact vias. Furthermore, active device applications of the present invention include the processing and fabrication of interconnect wiring and contact vias to polysilicon gate MOSFETs, that are comprised of low resistance salicide (self-aligned) and silicide polysilicon gate structures for both MOSFET and CMOS device applications with both N-channel and P-channel devices. By repeating the process or method described in the present invention, that is, fabricating interconnect wiring and contact vias, and further repeating the outlined process described herein, multilevel conducting structures comprised of a second layer of interconnect wiring and contact vias are formed over the initial, first layer of interconnects and contact vias.

While the invention has been particularly shown and described with reference to the preferred embodiments thereof, it will be understood by those skilled in the art that various changes in form and details may be made without departing from the spirit and scope of the invention.

What is claimed is:

1. A method for fabricating integrated circuits on a substrate with single or dual damascene structure, the method comprising:

providing a substrate or substrate module having a layer of dielectric, interlevel dielectric (ILD), or an interconnect line or conducting region;

providing a first level of conducting wiring being defined and embedded in a first layer of insulator;

depositing a second layer of insulator on the first layer of insulator;

patterning and etching the second layer of insulator to form both single and dual damascene trench/via and interconnect structures;

depositing on the second layer of insulator by reactive ion metal plasma (IMP) a TaN barrier layer with and without AC/Rf bias, in a series of steps or cycles of at least four or more AC/Rf bias On, AC/Rf bias OFF steps and patterning barrier layer;

depositing on the barrier layer by ion metal plasma (IMP) a copper seed layer with and without AC/Rf bias, in a series of steps or cycles of at least four or more AC/Rf bias ON, AC/Rf bias OFF steps and patterning said seed layer;

depositing on the copper seed layer by electrochemical deposition (ECD) a copper conducting material by plating copper in a sulfuric acid solution with a solution or plating bath temperature from approximately −40 to 40° C., at a deposition rate of approximately 1,000 Angstroms per minute, forming a copper conducting material thickness from approximately 5,000 to 20,000 Angstroms thick, forming copper grains or crystals from approximately 1,000 to 20,000 Angstroms in size, having a preferred (111) crystal orientation, with a re-crystallization temperature of approximately 100 to 300° C.;

polishing back by chemical mechanical polishing (CMP) the excess copper conducting material, seed layer, and barrier layer.

2. The method of claim 1, wherein said substrate is semiconductor single crystal silicon or an IC module.

3. The method of claim 1, wherein said substrate is semiconductor single crystal silicon, N-type or P-type, with conducting regions being: doped source and drain regions of MOSFET and CMOS devices, comprised of interconnect wiring and contact vias selected from the group consisting of Cu, AlCu, W, with silicide, polysilicon gate structures of MOSFET and CMOS devices.

4. The method of claim 1, wherein first and second layers of insulators or dielectric layers form intermetal dielectric layers (IMD) that are comprised or composed of silicon dioxide or silicon oxide.

5. The method of claim 1, wherein in the trench or channel and said via hole contact is lined with a diffusion barrier liner, which also aids adhesion, deposited by a special reactive ion metal plasma (IMP) which is a sputtering physical vapor deposition (PVD) technique, the liner material comprised of TaN, thickness from 100 to 500 Angstroms, extending to Ta/TaN/TaN barrier layers for better adhesion.

6. The method of claim 1, wherein the trench or channel and said via hole contact is lined with TaN, a diffusion barrier liner, deposited by a special reactive ion metal plasma (IMP) technique, wherein the power is cycled with and without AC/Rf bias, in a series of steps or cycles of at least four or more AC/Rf bias ON, AC/Rf bias OFF steps.

7. The method of claim 1, wherein the barrier layer process details are as follows: reactive ion metal plasma (IMP) sputter, a cluster tool, sputter target size 300 mm, gases Ar and $N_2$, Ar flow rate of about 50 sccm, substrate temperature of about 100° C., total film thickness deposited of about 300 Angstroms, deposition rate of about 600 Angstroms per minute, number of cycles from about 4 to 10, thickness deposition per step is equal to (total film thickness/number of steps), order or sequence of steps is AC "OFF" to AC "ON", to AC "OFF" to AC "ON", etc., pressure of 20 mTorr, DC magnetron power of 1 KW, AC/Rf power of 1.5 KW, AC bias of 350 W, Rf frequency of about 2 MHz.

8. The method of claim 1, wherein in the trench or channel and said via hole contact is lined with a copper seed layer deposited by special ion metal plasma (IMP) which is a sputtering physical vapor deposition (PVD) technique, the seed layer type material is comprised of a copper layer, thickness from 800 to 2500 Angstroms.

9. The method of claim 1, wherein the trench or channel and said via hole contact is lined with a copper seed layer deposited by a special ion metal plasma (IMP) technique, wherein the power is cycled with and without AC/Rf bias, in a series of steps or cycles of at least four or more AC/Rf bias ON, AC/Rf bias OFF steps.

10. The method of claim 1, wherein the seed layer process details are as follows: ion metal plasma (IMP) sputter, a cluster tool, sputter target size 300 mm, Ar gas, Ar flow rate of about 50 sccm, substrate temperature of about 25° C., total film thickness deposited from about 800 to 2500 Angstroms, deposition rate of about 1500 Angstroms per minute, number of cycles from about 4 to 10, thickness deposition per step is equal to (total film thickness/number of steps), order or sequence of steps is AC "OFF" to AC "ON", to AC "OFF" to AC "ON", etc., pressure of 40 mTorr, DC magnetron power of 1 KW, DC bias of 350 V, AC/Rf power of 3 KW, AC bias of 350 W, Rf frequency of about 2 MHz.

11. The method of claim 1, wherein the conducting material layers for conducting interconnect lines and said via contacts comprise the following conducting type materials: electrochemical deposition (ECD) of copper, upon the copper seed layer, ECD Cu thickness from 5000 to 20000 Angstroms.

12. The method of claim 1, wherein the ECD copper is electrochemically deposited in the trench/via structures without seams or voids upon said seed layer and said barrier layer.

13. The method of claim 1, wherein multilevel conducting structures are fabricating by repeating the process described herein.

14. The method of claim 1, wherein each level of conducting structure is planarized by removing excess conducting material, including planarization by chemical mechanical polish (CMP), milling, ion milling, and/or etching.

15. A method for fabricating integrated circuits on a substrate with single or dual damascene structure, the method comprising:

providing a semiconductor substrate or substrate module having a layer of dielectric silicon oxide, interlevel dielectric (ILD), or a copper interconnect line or conducting P–N junction region;

providing a first level of copper conducting wiring being defined and embedded in a first layer of silicon oxide insulator;

depositing a second layer of silicon oxide insulator on the first layer of insulator;

patterning and etching the second layer of insulator to form both single and dual damascene trench/via and interconnect structures;

deposition on the second layer of insulator by reactive ion metal plasma (IMP) a TaN barrier layer with and without AC/Rf bias, in a series of steps or cycles of at least four or more AC/Rf bias ON, AC/Rf bias OFF steps and patterning barrier layer;

depositing on the barrier layer by ion metal plasma (IMP) a copper seed layer with and without AC/Rf bias, in a series of steps or cycles of at least four or more AC/Rf bias ON, AC/Rf bias OFF steps and patterning said seed layer;

depositing on the copper seed layer by electrochemical deposition (ECD) a copper conducting material by plating copper in a sulfuric acid solution with a solution or plating bath temperature from approximately −40 to 40° C., at a deposition rate of approximately 1,000 Angstroms per minute, forming a copper conducting material thickness from approximately 5,000 to 20,000 Angstroms thick, forming copper grains or crystals from approximately 1,000 to 20,000 Angstroms in size, having a preferred (111) crystal orientation, with a re-crystallization temperature of approximately 100 to 300° C.;

polishing back by chemical mechanical polishing (CMP) the excess copper conducting material, seed layer, and barrier layer.

16. The method of claim 15, wherein multilevel conducting structures are fabricating by repeating the process described herein.

17. The method of claim 15, wherein said substrate is semiconductor single crystal silicon or an IC module.

18. The method of claim 15, wherein said substrate is semiconductor single crystal silicon, N-type or P-type, with conducting regions being: doped source and drain regions of MOSFET and CMOS devices, comprised of interconnect wiring and contact vias selected from the group consisting of Cu, AlCu, W, with silicide, polysilicon gate structures of MOSFET and CMOS devices.

19. The method of claim 15, wherein first and second layers of insulators or dielectric layers form intermetal dielectric layers (IMD) that are comprised or composed of silicon dioxide or silicon oxide.

20. The method of claim 15, wherein in the trench or channel and said via hole contact is lined with a diffusion barrier liner, which also aids adhesion, deposited by a special reactive ion metal plasma (IMP) which is a sputtering physical vapor deposition (PVD) technique, the liner material comprised of TaN, thickness from 100 to 500 Angstroms, extending to Ta/TaN/TaN barrier layers for better adhesion.

21. The method of claim 15, wherein the trench or channel and said via hole contact is lined with TaN, a diffusion barrier liner, deposited by a special reactive ion metal plasma (IMP) technique, wherein the power is cycled with and without AC/Rf bias, in a series of steps or cycles of at least four or more AC/Rf bias ON, AC/Rf bias OFF steps.

22. The method of claim 15, wherein the barrier layer process details are as follows: reactive ion metal plasma (IMP) sputter, a cluster tool, sputter target size 300 mm, gases Ar and $N_2$, Ar flow rate of about 50 sccm, substrate temperature of about 100° C., total film thickness deposited of about 300 Angstroms, deposition rate of about 600 Angstroms per minutes, number of cycles from about 4 to 10, thickness deposition per step is equal to (total film thickness/number of steps), order or sequence of steps is AC "OFF" to AC"ON", to AC "OFF" to AC "ON", etc., pressure of 20 mTorr, DC magnetron power of 1 KW, AC/Rf power of 1.5 KW, AC bias of 350 W, Rf frequency of about 2 MHz.

23. The method of claim 15, wherein in the trench or channel and said via hole contact is lined with a copper seed layer deposited by special ion metal plasma (IMP) which is a sputtering physical vapor deposition (PVD) technique, the seed layer type material is comprised of a copper layer, thickness from 800 to 2500 Angstroms.

24. The method of claim 15, wherein the trench or channel and said via hole contact is lined with a copper seed layer deposited by a special ion metal plasma (IMP) technique, wherein the power is cycled with and without AC/Rf bias, in a series of steps or cycles of at least four or more AC/Rf bias ON, AC/Rf bias OFF steps.

25. The method of claim 15, wherein the seed layer process details are as follows: ion metal plasma (IMP) sputter, a cluster tool, sputter target size 300 mm, Ar gas, Ar flow rate of about 50 sccm, substrate temperature of about 25° C., total film thickness deposited from about 800 to 2500 Angstroms, deposition rate of about 1500 Angstroms per minute, number of cycles from about 4 to 10, thickness deposition per step is equal to (total film thickness/number of steps), order or sequence of steps is AC "OFF" to AC "ON", to AC "OFF" to AC "ON", etc., pressure of 40 mTorr, DC magnetron power of 1 KW, DC bias of 350 V, AC/Rf power of 3 KW, AC bias of 350 W, Rf frequency of about 2 MHz.

26. The method of claim 15, wherein the conducting material layers for conducting interconnect lines and said via contacts comprise the following conducting type materials: electrochemical deposition (ECD) of copper, upon the copper seed layer, ECD Cu thickness from 5000 to 20000 Angstroms.

27. The method of claim 15, wherein the ECD copper is electrochemically deposited in the trench/via structures without seams or voids upon said seed layer and said barrier layer.

28. The method of claim 15, wherein each level of conducting structure is planarized by removing excess conducting material, include planarization by chemical mechanical polish (CMP), milling, ion milling, and/or etching.

29. A method for fabricating MOSFET and CMOS devices on a silicon semiconductor substrate with single or dual damascene structures using electrochemical deposition (ECD) of copper and ion metal plasma (IMP) deposition of copper seed layer and barrier layer, the method comprising:

providing a semiconductor substrate or substrate module having a layer of dielectric silicon oxide, interlevel dielectric (ILD), or a copper interconnect line or conducting P-N junction region;

providing a first level of copper conducting wiring being defined and embedded in a first layer of silicon oxide insulator;

depositing a second layer of silicon oxide insulator on the first layer of insulator;

patterning and etching the second layer of insulator to form both single and dual damascene trench/via and interconnect structures;

depositing on the second layer of insulator by reactive ion metal plasma (IMP) a TaN barrier layer with and without AC/Rf bias, in a series of steps or cycles of at least four or more AC/Rf bias ON, AC/Rf bias OFF steps and patterning barrier layer;

depositing on the barrier layer by ion metal plasma (IMP) a copper seed layer with and without AC/Rf bias, in a series of steps or cycles of at least four or more AC/Rf bias ON, AC/Rf bias OFF steps and patterning said seed layer;

depositing on the copper seed layer by electrochemical deposition (ECD) a copper conducting material by plating copper in a sulfuric acid solution with a solution or plating bath temperature from approximately −40 to 40° C., at a deposition rate of approximately 1,000 Angstroms per minute, forming a copper conducting material thickness from approximately 5,000 to 20,000 Angstroms thick, forming copper grains or crystals from approximately 1,000 to 20,000 Angstroms in size, having a preferred (111) crystal orientation, with a re-crystallization temperature of approximately 100 to 300° C.;

polishing back by chemical mechanical polishing (CMP) the excess copper conducting material, seed layer, and barrier layer.

30. The method of claim 29, wherein multilevel conducting structures are fabricating by repeating the process described herein.

31. The method of claim 29, wherein each level of conducting structure is planarized by removing excess conducting material, include planarization by chemical mechanical polish (CMP), milling, ion milling, and/or etching.

32. The method of claim 29, wherein said substrate is semiconductor single crystal silicon or an IC module.

33. The method of claim 29, wherein said substrate is semiconductor single crystal silicon, N-type or P-type, with conducting regions being: doped source and drain regions of MOSFET and CMOS devices, comprised of interconnect wiring and contact vias selected from the group consisting of Cu, AlCu, W, with silicide, polysilicon gate structures of MOSFET and CMOS devices.

34. The method of claim 29, wherein first and second layers of insulators or dielectric layers form intermetal dielectric layers (IMD) that are comprised or composed of silicon dioxide or silicon oxide.

35. The method of claim 29, wherein in the trench or channel and said via hole contact is lined with a diffusion barrier liner, which also aids adhesion, deposited by a special reactive ion metal plasma (IMP) which is a sputtering physical vapor deposition (PVD) technique, the liner material comprised of TaN, thickness from 100 to 500 Angstroms, extending to Ta/TaN/TaN barrier layers for better adhesion.

36. The method of claim 29, wherein the trench or channel and said via hole contact is lined with TaN, a diffusion barrier liner, deposited by a special reactive ion metal plasma (IMP) technique, wherein the power is cycled with and without AC/Rf bias, in a series of steps or cycles of at least four or more AC/Rf bias ON, AC/Rf bias OFF steps.

37. The method of claim 29, wherein the barrier layer process details are as follows: reactive ion metal plasma (IMP) sputter, a cluster tool, sputter target size 300 mm, gases Ar and $N_2$, Ar flow rate of about 50 sccm, substrate temperature of about 100° C., total film thickness deposited of about 300 Angstroms, deposition rate of about 600 Angstroms per minute, number of cycles from about 4 to 10, thickness deposition per step is equal to (total film thickness/number of steps), order or sequence of steps is AC "OFF" to AC "ON", to AC "OFF" to AC "ON", etc., pressure of 20 mTorr, DC magnetron power of 1 KW, AC/Rf power of 1.5 KW, AC bias of 350 W, Rf frequency of about 2 MHz.

38. The method of claim 29, wherein in the trench or channel and said via hole contact is lined with a copper seed layer deposited by special ion metal plasma (IMP) which is a sputtering physical vapor deposition (PVD) technique, the seed layer type material is comprised of a copper layer, thickness from 800 to 2500 Angstroms.

39. The method of claim 29, wherein the trench or channel and said via hole contact is lined with a copper seed layer deposited by a special ion metal plasma (IMP) technique, wherein the power is cycled with and without AC/Rf bias, in a series of steps or cycles of at least four or more AC/Rf bias ON, AC/Rf bias OFF steps.

40. The method of claim 29, wherein the seed layer process details are as follows: ion metal plasma (IMP) sputter, a cluster tool, sputter target size 300 mm, Ar gas, Ar flow rate of about 50 sccm, substrate temperature of about 25° C., total film thickness deposited from about 800 to 2500 Angstroms, deposition rate of about 1500 Angstroms per minute, number of cycles from about 4 to 10, thickness deposition per step is equal to (total film thickness/number of steps), order or sequence of steps is AC "OFF" to AC "ON", to AC "OFF" to AC "ON", etc., pressure of 40 mTorr, DC magnetron power of 1 KW, DC bias of 350 V, AC/Rf power of 3 KW, AC bias of 350 W, Rf frequency of about 2 MHz.

41. The method of claim 29, wherein the conducting material layers for conducting interconnect lines and said via contacts comprise the following conducting type materials: electrochemical deposition (ECD) of copper, upon the copper seed layer, ECD Cu thickness from 5000 to 20000 Angstroms.

42. The method of claim 29, wherein the ECD copper is electrochemically deposited in the trench/via structures without seams or voids upon said seed layer and said barrier layer.

* * * * *